(12) United States Patent
Kim et al.

(10) Patent No.: US 11,482,686 B2
(45) Date of Patent: Oct. 25, 2022

(54) LIGHT EMITTING DEVICE, PRODUCTION METHOD THEREOF, AND DISPLAY DEVICE INCLUDING THE SAME

(71) Applicant: SAMSUNG ELECTRONICS CO., LTD., Suwon-si (KR)

(72) Inventors: Kwanghee Kim, Seoul (KR); Moon Gyu Han, Suwon-si (KR); Eun Joo Jang, Suwon-si (KR); Hyo Sook Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 169 days.

(21) Appl. No.: 17/085,167

(22) Filed: Oct. 30, 2020

(65) Prior Publication Data

US 2021/0135138 A1 May 6, 2021

(30) Foreign Application Priority Data

Oct. 31, 2019 (KR) .................. 10-2019-0137994

(51) Int. Cl.
*H01L 29/06* (2006.01)
*H01L 51/50* (2006.01)
(Continued)

(52) U.S. Cl.
CPC ............ *H01L 51/502* (2013.01); *C09K 11/02* (2013.01); *C09K 11/883* (2013.01); *H01L 51/56* (2013.01); *B82Y 20/00* (2013.01); *B82Y 40/00* (2013.01)

(58) Field of Classification Search
CPC . H01L 51/0071; H01L 51/502; C07D 265/38; C09K 11/02
See application file for complete search history.

(56) References Cited

U.S. PATENT DOCUMENTS 7,615,800 B2 11/2009 Kahen
7,777,233 B2 8/2010 Kahen et al.
(Continued)

FOREIGN PATENT DOCUMENTS

JP 2010520603 A 6/2010
JP 2011502333 A 1/2011
(Continued)

OTHER PUBLICATIONS

David Valdesueiro et al., "Deposition Mechanism of Aluminum Oxide on Quantum Dot Films at Atmospheric Pressure and Room Temperature," The Journal of Physical Chemistry C, Feb. 19, 2016, pp. 4266-4275, vol. 120.
(Continued)

*Primary Examiner* — Caleb E Henry
(74) *Attorney, Agent, or Firm* — Cantor Colburn LLP

(57) ABSTRACT

A light emitting device including a first electrode and a second electrode spaced from each other, and, a light emitting film between the first electrode and the second electrode, wherein the light emitting film has a first surface facing the second electrode and a second surface opposite thereto, the light emitting film includes a quantum dot layer including a plurality of quantum dots and a matrix including a metal chalcogenide, the plurality of quantum dots includes selenium, the matrix covers at least a portion of the quantum dot layer, the metal chalcogenide comprises zinc and sulfur, and in an X-ray photoelectron spectroscopic analysis of the first surface of the light emitting film, a mole ratio of zinc with respect to selenium is greater than or equal to about 2:1 and a mole ratio of sulfur with respect to selenium is greater than or equal to about 1.1:1.

22 Claims, 3 Drawing Sheets
(1 of 3 Drawing Sheet(s) Filed in Color)

(51) Int. Cl.
   *H01L 51/56*    (2006.01)
   *C09K 11/02*    (2006.01)
   *C09K 11/88*    (2006.01)
   *B82Y 40/00*    (2011.01)
   *B82Y 20/00*    (2011.01)

(56) References Cited

U.S. PATENT DOCUMENTS

| | | | |
|---|---|---|---|
| 7,880,377 B2 | 2/2011 | Orita et al. | |
| 7,888,700 B2 | 2/2011 | Kahen | |
| 8,242,515 B2 | 8/2012 | Kahen et al. | |
| 10,128,417 B2 | 11/2018 | Hartlove et al. | |
| 2007/0012355 A1 | 1/2007 | LoCascio et al. | |
| 2012/0282730 A1* | 11/2012 | Liao | H01L 21/02568 977/773 |
| 2013/0306945 A1* | 11/2013 | Seo | H01L 51/5012 257/40 |
| 2014/0034930 A1* | 2/2014 | Seo | H01L 51/0054 257/40 |
| 2015/0041759 A1* | 2/2015 | Kahen | H01L 33/06 438/47 |
| 2015/0340623 A1* | 11/2015 | Kawamura | C09K 11/06 257/40 |
| 2016/0028022 A1* | 1/2016 | Seo | C07D 403/14 257/40 |
| 2016/0093812 A1* | 3/2016 | Stoessel | H01L 51/0072 438/46 |
| 2017/0130127 A1* | 5/2017 | Kamplain | H01L 21/02546 |
| 2018/0277765 A1* | 9/2018 | Yen | C07D 495/16 |
| 2019/0031906 A1* | 1/2019 | Kim | H01L 21/0274 |
| 2019/0189925 A1* | 6/2019 | Wang | C07D 241/42 |
| 2019/0229270 A1* | 7/2019 | Yen | C07D 409/14 |
| 2020/0212306 A1* | 7/2020 | Konishi | H01L 51/0043 |
| 2020/0407635 A1* | 12/2020 | Kim | C09K 11/70 |
| 2021/0167304 A1* | 6/2021 | Scholz | C09K 11/06 |

FOREIGN PATENT DOCUMENTS

| | | |
|---|---|---|
| JP | 4781821 B2 | 9/2011 |
| JP | 5043848 B2 | 10/2012 |
| KR | 1020160147526 A | 12/2016 |

OTHER PUBLICATIONS

Wan Ki Bae et al., "Highly Effective Surface Passivation of PbSe Quantum Dots through Reaction with Molecular Chlorine," Journal of the American Chemical Society, Nov. 6, 2012, pp. 20160-20168, vol. 134.

Byoung-Ho Kang et al., "Efficient exciton generation in atomic passivated CdSe/ZnS quantum dots light-emitting devices," Scientific Reports, Sep. 30, 2016, pp. 1-8, vol. 6, Issue 34659, DOI: 10.1038/srep34659.

Eunjoo Jang et al., "White-Light-Emitting Diodes with Quantum Dot Color Converters for Display Backlights," Adv. Mater., May 31, 2010, pp. 3076-3080, vol. 22.

N. S. Kurochkina, "Effect of the Length of Ligands Passivating Quantum Dots on the Electrooptical Characteristics of Organic Light," Semiconductors, Amorphous, Vitreous, and Organic Semiconductors, 2015, pp. 953-958, vol. 49, Issue 7.

Seth Coe et al., "Electroluminescence from single monolayers of nanocrystals in molecular organic devices," Nature, Dec. 26, 2002, pp. 800-803, vol. 420.

Tae-Ho Kim et al., "Full-colour quantum dot displays fabricated by transfer printing," Nature Photonics, Feb. 20, 2011, pp. 176-182, vol. 5.

Xingliang Dai et al., "Solution-processed, high-performance light-emitting diodes based on quantum dots," Nature, Oct. 29, 2014, pp. 96-99, vol. 515.

Young Ran Park et al., "Quantum-Dot Light-Emitting Diodes with Nitrogen-Doped Carbon Nanodot Hole Transport and Electronic Energy Transfer Layer," scientificreports, Apr. 12, 2017, pp. 1-13, vol. 7, Issue 46422, DOI: 10.1038/srep46422.

* cited by examiner

LIGHT EMITTING DEVICE, PRODUCTION METHOD THEREOF, AND DISPLAY DEVICE INCLUDING THE SAME

CROSS-REFERENCE TO RELATED APPLICATION

This application claims priority to and the benefit of Korean Patent Application No. 10-2019-0137994 filed in the Korean Intellectual Property Office on Oct. 31, 2019, and all the benefits accruing therefrom under 35 U.S.C. § 119, the entire content of which in its entirety is herein incorporated by reference.

BACKGROUND

1. Field

A light emitting device, a production method thereof, and a display device are disclosed.

2. Description of the Related Art

Physical characteristics (e.g., bandgap energies, melting points, etc.) of nanoparticles that are intrinsic characteristics may be controlled by changing their particle sizes, unlike bulk materials. For example, semiconductor nanocrystals also known as quantum dots may be supplied with photo-energy or electrical energy and may emit light in a wavelength corresponding to sizes of the quantum dots. Accordingly, the quantum dots may be used as a light emitting element emitting light of a predetermined wavelength.

SUMMARY

An embodiment provides a light emitting device capable of realizing improved performance (e.g., life-span characteristics).

An embodiment provides a method of producing the aforementioned light emitting device.

An embodiment provides a display device including the light emitting device.

A light emitting device according to an embodiment includes a first electrode and a second electrode spaced from each other, and a light emitting film disposed between the first electrode and the second electrode, wherein the light emitting film has a first surface facing the second electrode and a second surface opposite the first surface, the light emitting film includes a quantum dot layer including a plurality of quantum dots and a matrix including a metal chalcogenide, the plurality of quantum dots includes selenium, the matrix covers at least a portion of the quantum dot layer, and the metal chalcogenide includes zinc and sulfur. In the first surface of the light emitting film (for example, in an X-ray photoelectron spectroscopic analysis for the first surface of the light emitting film), a mole ratio of zinc with respect to selenium is greater than or equal to about 2:1, greater than or equal to about 2.4:1, greater than or equal to about 2.9:1, or greater than or equal to about 3:1, and a mole ratio of sulfur with respect to selenium is greater than or equal to about 1.1:1.

The metal chalcogenide may further include selenium.

The plurality of quantum dots may not include cadmium, lead, or a combination thereof.

The quantum dots may include a core including a first semiconductor nanocrystal and a shell disposed on the core, the shell including a second semiconductor nanocrystal having a composition different from a composition of the first semiconductor nanocrystal.

The shell may include the metal chalcogenide. The quantum dots may include zinc and sulfur in the shell or an outermost layer of the shell.

The first semiconductor nanocrystal and the second semiconductor nanocrystal may independently be a Group II-VI compound, a Group III-V compound, a Group IV-VI compound, a Group IV element or a compound thereof, a Group I-III-VI compound, a Group III-IV-VI compound, or a combination thereof.

The first semiconductor nanocrystal may include indium, zinc, or a combination thereof.

The quantum dots (or the first semiconductor nanocrystal) may include InP, InZnP, ZnSe, ZnSeTe, or a combination thereof.

The quantum dots may include zinc.

In the quantum dots, a mole ratio of zinc with respect to selenium may be greater than or equal to about 1.5:1.

The matrix may include a zinc chalcogenide layer. The zinc chalcogenide layer may constitute at least a portion of the first surface of the light emitting film. The first surface of the light emitting film may be formed of the matrix.

A thickness of the zinc chalcogenide layer may be greater than or equal to about 0.5 nanometers (nm), greater than or equal to about 1 nm, greater than or equal to about 1.5 nm, or greater than or equal to about 2 nm. The thickness of the zinc chalcogenide layer may be less than or equal to about 10 nm, less than or equal to about 9 nm, less than or equal to about 8 nm, less than or equal to about 7 nm, less than or equal to about 6 nm, or less than or equal to about 5 nm.

The zinc chalcogenide layer may not include selenium.

The zinc chalcogenide layer may not include zinc sulfide.

In the first surface of the light emitting film, a mole ratio of zinc with respect to selenium (Zn:Se) may be greater than or equal to about 3.1:1, greater than or equal to about 3.2:1, greater than or equal to about 3.3:1, greater than or equal to about 3.4:1, greater than or equal to about 3.5:1, greater than or equal to about 3.6:1, greater than or equal to about 3.7:1, greater than or equal to about 3.8:1, greater than or equal to about 3.9:1, greater than or equal to about 4:1, greater than or equal to about 4.1:1, greater than or equal to about 4.2:1, greater than or equal to about 4.3:1, greater than or equal to about 4.4:1, greater than or equal to about 4.5:1, greater than or equal to about 4.6:1, greater than or equal to about 4.7:1, greater than or equal to about 4.8:1, greater than or equal to about 4.9:1, greater than or equal to about 5:1, greater than or equal to about 5.1:1, greater than or equal to about 5.2:1, greater than or equal to about 5.3:1, greater than or equal to about 5.4:1, greater than or equal to about 5.5:1, greater than or equal to about 6:1, greater than or equal to about 6.5:1, or greater than or equal to about 7:1. In an X-ray photoelectron spectroscopic analysis of the first surface of the light emitting film, a mole ratio of sulfur with respect to selenium (S:Se) may be greater than or equal to about 1.3:1, greater than or equal to about 1.4:1, greater than or equal to about 1.5:1, greater than or equal to about 2:1, greater than or equal to about 2.5:1, greater than or equal to about 3:1, greater than or equal to about 3.5:1, or greater than or equal to about 4:1.

The light emitting film may further include an organic compound, and in an X-ray photoelectron spectroscopic analysis of the first surface of the light emitting film, a mole ratio of carbon with respect to zinc (C:Zn) may be greater than or equal to about 0.1:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, greater than or equal to about 0.9:1, greater than or equal to about 1:1, greater than or equal to about 1.5:1, or greater than or equal to about 1.8:1. In the light emitting film, the mole ratio (C:Zn) of carbon with respect to zinc may be less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, less than or equal to about 2.1:1, less than or equal to about 1.9:1, less than or equal to about 1.8:1, less than or equal to about 1.7:1, or less than or equal to about 1.6:1.

The light emitting film may further include halogen. The halogen may be fluorine, chlorine, bromine, iodine, or a combination thereof. In the light emitting film, a mole ratio of halogen with respect to selenium may be greater than or equal to about 0.1:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, greater than or equal to about 0.9:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, or greater than or equal to about 2.9:1. In the light emitting film, the mole ratio of halogen with respect to selenium may be less than or equal to about 5:1, less than or equal to about 4:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, less than or equal to about 2.1:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, less than or equal to about 0.9:1, less than or equal to about 0.8:1, less than or equal to about 0.7:1, less than or equal to about 0.6:1, or less than or equal to about 0.5:1.

In the first surface of the light emitting film, a mole ratio (Zn:(S+Se)) of zinc with respect to a sum of chalcogen elements may be greater than or equal to about 1.1:1, greater than or equal to about 1.2:1, greater than or equal to about 1.3:1, or greater than or equal to about 1.4:1. In the first surface of the light emitting film, the mole ratio (Zn:(S+Se)) of zinc with respect to a chalcogen element may be less than or equal to about 3:1, less than or equal to about 2.5:1, or less than or equal to about 2:1.

In the first surface of the light emitting film, a mole ratio (Zn:S) of zinc with respect to sulfur may be greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, or greater than or equal to about 2.4:1. The mole ratio (Zn:S) of zinc with respect to sulfur may be less than or equal to about 5:1, less than or equal to about 4:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1 less than or equal to about 2.3:1, less than or equal to about 2.2:1, or less than or equal to about 2.1:1.

The light emitting device may further include an electron auxiliary layer adjacent to or directly on the first surface of the light emitting film.

The electronic auxiliary layer may include metal oxide nanoparticles.

The metal oxide nanoparticles may include zinc oxide, zinc magnesium oxide, tin oxide, titanium oxide, or a combination thereof.

A metal oxide of the metal oxide nanoparticles may be represented by

Chemical Formula 1:

   Chemical Formula 1

In Chemical Formula 1,
M is Mg, Ca, Zr, W, Li, Ti, Y, Al, or a combination thereof, and
$0 \leq x \leq 0.5$.

An average particle size of the nanoparticles may be greater than or equal to about 1 nm.

The average particle size of the nanoparticles may be less than or equal to about 10 nm, or less than or equal to about 5 nm.

A thickness of the light emitting film may be greater than or equal to about 20 nm.

The thickness of the light emitting film may be less than or equal to about 50 nm.

The light emitting device may emit blue light. The light emitting device may have a maximum luminance of greater than or equal to about 10,000 candelas per square meter (cd/m$^2$). The light emitting device may have a T95 of greater than or equal to about 6 h. The light emitting device may have T50 of greater than or equal to about 10 hours.

In an embodiment, a method of producing the aforementioned light emitting device includes providing the first electrode; forming the light emitting film on the first electrode by providing the layer comprising the plurality of quantum dots; adding a matrix former in which a sulfur precursor and a zinc precursor are dissolved in a polar solvent to the layer comprising the plurality of quantum dots; and heat-treating the layer comprising the plurality of quantum dots to which the matrix former is added at a temperature of less than or equal to about 120° C. to form the light emitting film on the first electrode; and providing the second electrode on the light emitting film to produce the light emitting device.

The method may further include washing the formed light emitting film one or more times with a polar solvent.

The sulfur precursor may be an organic compound having no thiol group.

The sulfur precursor may include a thioamide compound, a thioester compound, or a combination thereof.

The zinc precursor may include a zinc halide, a zinc ester, a zinc nitrate, a zinc carboxylate, or a combination thereof.

The polar solvent may include a C1 to C10 alcohol solvent, or a combination thereof.

An embodiment provides a display device including the aforementioned light emitting device.

In a device according to an embodiment (e.g., an electroluminescent device), a matrix in a light emitting film may provide additional inorganic shell passivation for quantum dots, and quenching may be suppressed at the interface of a light emitting film and a charge auxiliary layer (e.g., an inorganic material-based electron auxiliary layer).

The device of one embodiment may exhibit an improved life-span without a substantial decrease in luminous efficiency.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other advantages and features of this disclosure will become more apparent by describing in further detail exemplary embodiments thereof with reference to the accompanying drawings, in which.

DETAILED DESCRIPTION

Figure 1:
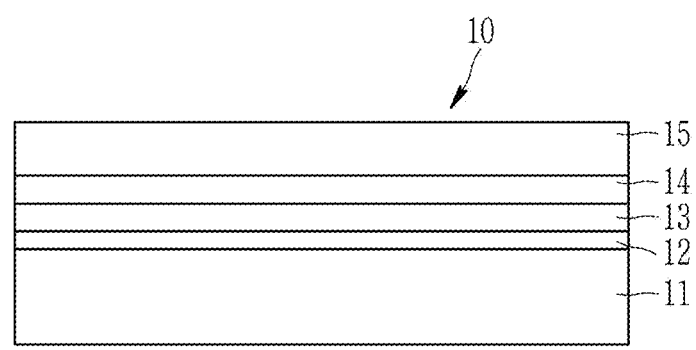
FIG. 1 is a schematic cross-sectional view showing a light emitting device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the values of the work function, conduction band, or lowest unoccupied molecular orbital (LUMO) (or valence band or highest occupied molecular orbital (HOMO)) energy level are expressed as an absolute value from a vacuum level. Also, a deep, high, or large work function or energy level means that the absolute value is large with a vacuum level of "0 electronvolts (eV)," and a shallow, low, or small work function or energy level means that the absolute value is small with a vacuum level of "0 eV."

As used herein, "Group" refers to a group of Periodic Table.

As used herein, "Group I" refers to Group IA and Group IB, and examples may include Li, Na, K, Rb, and Cs but are not limited thereto.

As used herein, "Group II" refers to Group IIA and Group IIB, and examples of Group II metal may include Cd, Zn, Hg, and Mg, but are not limited thereto.

As used herein, "Group III" refers to Group IIIA and Group IIIB, and examples of Group III metal may include Al, In, Ga, and TI, but are not limited thereto.

As used herein, "Group IV" refers to Group IVA and Group IVB, and examples of a Group IV metal may include Si, Ge, and Sn, but are not limited thereto. As used herein, the term "metal" may include a semi-metal such as Si.

As used herein, "Group V" may refer to Group VA, and examples thereof may include nitrogen, phosphorus, arsenic, antimony, and bismuth, but are not limited thereto.

As used herein, "Group VI" may refer to Group VIA, and examples thereof may include sulfur, selenium, and tellurium, but are not limited thereto.

As used herein, when a definition is not otherwise provided, "substituted" refers to replacement of hydrogen of a compound, a group, or a moiety by a substituent such as a C1 to C30 alkyl group, a C2 to C30 alkenyl group, a C2 to C30 alkynyl group, a C2 to C30 epoxy group, a C2 to C30 alkenyl group, a C2 to C30 alkylester group, a C3 to C30 alkenylester group (e.g., acrylate group, methacrylate group), a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (e.g., —PO$_3$MH or —PO$_3$M$_2$, wherein M is an organic or inorganic cation), or a combination thereof.

As used herein, the expression "not including cadmium (or other harmful heavy metal)" may refer to the case in which a concentration of cadmium (or a harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy). As used herein, unless explicitly defined as being singular, the description of the singular is intended to include the plural.

Hereinafter, a light emitting device according to an embodiment is described with reference to the drawings.

FIG. 1 is a schematic cross-sectional view showing a light emitting device according to an embodiment. Referring to FIG. 1, the light emitting device 10 according to an embodiment includes electrodes facing each other (a first electrode and a second electrode) and a light emitting film 13 including a plurality of quantum dots disposed therebetween. A charge auxiliary layer may be disposed between the light emitting film 13 and the electrodes. When the first electrode 11 is an anode and the second electrode 15 is a cathode, a hole auxiliary layer 12 that assists the movement (transport/injection) of holes between the first electrode and the light emitting film is provided and an electron auxiliary layer 14 that assists the movement (transport/injection) of electrons may be disposed between the second electrode and the light emitting film.

In one embodiment, the light emitting device may include a substrate (not shown). The substrate may be disposed on the first electrode 11 side or may be disposed on the second electrode 15 side. In an embodiment, the substrate may be disposed on the first electrode side (e.g., under the first electrode). The substrate may be a substrate including an insulating material (e.g., an insulating transparent substrate). The substrate may include glass; various polymers such as a polyester (e.g., polyethylene terephthalate (PET), polyethylene naphthalate (PEN)), a polycarbonate, a poly(meth)acrylate, a polyimide, or a polyamideimide; a polysiloxane (e.g., polydimethylsiloxane (PDMS)); an inorganic material such as glass, silicon, a silicon oxide, Al$_2$O$_3$, and the like; or a combination thereof, but is not limited thereto. Herein "transparent" refer to transmittance for light in a predetermined wavelength (e.g., light emitted from the quantum dot) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected taking into consideration a substrate material but is not particularly limited. The transparent substrate may have flexibility. The substrate may be omitted.

One of the first electrode 11 and the second electrode 15 is an anode, and the other is a cathode. For example, the first electrode 11 may be an anode, the second electrode 15 may be a cathode, and vice versa.

The first electrode 11 may be made of a conductor, for example, a metal, a conductive metal oxide, or a combination thereof. The first electrode 11 may be for example made of a metal such as nickel, platinum, vanadium, chromium, copper, zinc, and gold, or an alloy thereof; a conductive metal oxide such as zinc oxide, indium oxide, tin oxide, indium tin oxide (ITO), indium zinc oxide (IZO), or fluorine doped tin oxide; or a combination of a metal and oxide such as ZnO and Al or SnO$_2$ and Sb, but is not limited thereto. In an embodiment, the first electrode may include a transparent conductive metal oxide, for example, indium tin oxide. A work function of the first electrode may be higher than a work function of the second electrode as described herein. A work function of the first electrode may be lower than a work function of the second electrode as described herein.

The second electrode 15 may be made of a conductor, for example a metal, a conductive metal oxide, a conductive polymer, or a combination thereof. The second electrode 15 may be for example a metal such as aluminum, magnesium, calcium, sodium, potassium, titanium, indium, yttrium, lithium, gadolinium silver, tin, lead, cesium, or barium, or an alloy thereof; a multi-layered structured material such as LiF/Al, Li$_2$O/Al, 8-hydroxyquinolinato lithium, (Liq)/Al, LiF/Ca, and BaF$_2$/Ca, but is not limited thereto. In an embodiment, the second electrode may include a transparent conductive metal oxide, such as indium tin oxide. The conductive metal oxide is the same as described herein.

In an embodiment, a work function of first electrode (e.g., anode) may be greater than or equal to about 4.0 eV, greater than or equal to about 4.1 eV, greater than or equal to about 4.2 eV, greater than or equal to about 4.3 eV, greater than or equal to about 4.4 eV, greater than or equal to about 4.5 eV, greater than or equal to about 4.6 eV, greater than or equal to about 4.7 eV, or greater than or equal to about 4.8 eV and less than or equal to about 5.5 eV, less than or equal to about 5.4 eV, less than or equal to about 5.3 eV, less than or equal to about 5.2 eV, less than or equal to about 5.1 eV, less than or equal to about 5.0 eV, or less than or equal to about 4.9 eV, but is not limited thereto. A work function of the second electrode (e.g., cathode) may be greater than or equal to about 3.4 eV, for example greater than or equal to about 3.5 eV, greater than or equal to about 3.6 eV, greater than or equal to about 3.7 eV, greater than or equal to about 3.8 eV, greater than or equal to about 3.9 eV, greater than or equal to about 4.0 eV, greater than or equal to about 4.1 eV, greater than or equal to about 4.2 eV, greater than or equal to about 4.3 eV, greater than or equal to about 4.4 eV, or greater than or equal to about 4.5 eV and less than or equal to about 5.0 eV, less than or equal to about 4.9 eV, less than or equal to about 4.8 eV, less than or equal to about 4.7 eV, less than or equal to about 4.6 eV, less than or equal to about 4.5 eV, or less than or equal to about 4.4 eV, but is not limited thereto.

The first electrode 11, the second electrode 15, or a combination thereof may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, it may be made of for example an opaque conductor such as aluminum (Al), silver (Ag), or gold (Au).

A thickness of the electrode (the first electrode, the second electrode, or each of the first electrode and the second electrode) is not particularly limited and may be appropriately selected taking into consideration device efficiency. For example, the thickness of the electrode may be greater than or equal to about 5 nm, greater than or equal to about 50 nm, or greater than or equal to about 100 nm. For example, the thickness of the electrode may be less than or equal to about 100 micrometers ($\mu$m), for example, less than or equal to about 10 $\mu$m, or less than or equal to about 1 $\mu$m, less than or equal to about 900 nm, less than or equal to about 500 nm, less than or equal to about 400 nm, less than or equal to about 300 nm, less than or equal to about 200 nm, or less than or equal to about 100 nm.

The light emitting film 13 includes (e.g., a plurality of) quantum dots (hereinafter, also referred to semiconductor nanocrystals). The light emitting film has a first surface facing the second electrode and a second surface opposite thereto, and the light emitting film includes a quantum dot layer including a plurality of quantum dots and a matrix including a metal chalcogenide.

In the light emitting device of an embodiment, current is injected into the device when a voltage is applied (between the first/second electrodes). At this time, charge accumulation may occur when defects are present in the active region (e.g., the light emitting film). Charge accumulation may lead to changes of current-voltage (I-V) characteristics of the device and may have a negative effect on device reliability.

A quantum dot light emitting device (hereinafter, also referred to QD-LED) emitting light by applying a voltage includes quantum dots as a light emitting material. QD-LED adopts a different emission principle from that of an organic light emitting diode (OLED) emitting light by using an organic material as an emission center but may realize purer colors (red, green, blue) and improved color reproducibility and accordingly, is being paid attentions to as a next generation display device. QD-LED may be produced with a reduced cost by including a solution process and may be expected to realize increased stability because it is based on an inorganic material, but technology development for improving device properties and life-span characteristics is desired.

As for QD-LED including quantum dots as a light emitting material, QD nanoparticles having a large surface with respect to a bulk are aligned as a film shape. Accordingly, QD-LED may easily have defects on the QD surface, on the interface between the hole auxiliary layer and the light emitting film and on the interface between the electron auxiliary layer and the light emitting film. These defects may work as charge traps inside the device and thus cause charge accumulation and luminescence loss of the quantum dots. The accumulated charges may bring about a non-uniform charge distribution inside the device and change resistance of the device and thus increase a driving voltage of the device, and resultantly, photoluminescence characteristics of the device may be easily deteriorated.

In this regard, ligand exchange of each quantum dot may reinforce its passivation. For example, the ligand exchange related to a thiol compound may improve photoluminescence performance of the quantum dot. However, insulating characteristics of an organic ligand may restrict performance improvement of an electroluminescent device. In addition, in the electroluminescent device, when the thiol ligands disposed on the surface of the quantum dot may form a disulfide bond, when a voltage is applied thereto, and thus may be easily detached. A halogen-based inorganic ligand may be used to passivate the surface of each quantum dot. A bond between a metal exposed on the surface of the quantum dot and halide is expected to have positive influences on light emitting properties. However, the present inventors have found that the metal-halide may provide a single layer of passivation, but since this passivation thickness does not sufficiently protect a QD core, electroluminescent properties of the quantum dot may be changed by a surface of a shell, a ligand, and an ambient charging phenomenon.

In order to improve interface characteristics between the light emitting layer and the charge auxiliary layer, an ultra-thin PMMA film may be disposed as an interlayer. This interlayer may be very difficult to uniformly form with a desired thickness, and device characteristics including this interlayer may be sharply deteriorated due to a sharp resistance increase due to an increased thickness.

In the device according to an embodiment, the light emitting film includes a metal chalcogenide-based matrix along with a plurality of quantum dots. In the light emitting film, the matrix has a composition as described herein and covers a layer of the quantum dots and thus may more efficiently passivate defects on the interface of the auxiliary layer and the quantum dot light emitting layer as well as defects on the surface of each quantum dot and resultantly, contribute to improving performance and a life-span of the device.

In an embodiment, the quantum dots are core/shell type particles, a main component of the matrixes may include an inorganic component (e.g., zinc chalcogenide) of the quantum dot shell. The matrix may protect the quantum dots and provide the quantum dots with the additional inorganic shell passivation, for example, ease interface quenching between the QD light emitting layer and the electron auxiliary layer (e.g., ETL layer).

In an embodiment, the quantum dots may have a core shell structure and may include a core including a first semiconductor nanocrystal and a shell disposed on the core and including a second semiconductor nanocrystal having a composition different from that of the first semiconductor nanocrystal.

The quantum dot (e.g., first semiconductor nanocrystal, second semiconductor nanocrystal, or a combination thereof) may include a Group II-VI compound, a Group III-V compound, a Group IV-VI compound, a Group IV element or compound, I a Group I-III-VI Compound, a Group II-III-VI compound, a Group I-II-IV-VI compound, or a combination thereof. The light emitting film (or quantum dots, first semiconductor nanocrystal, or second semiconductor nanocrystal) may not include harmful heavy metals such as cadmium, lead, mercury, or a combination thereof. The plurality of quantum dots may include selenium.

The Group II-VI compound may be a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. The Group II-VI compound may further include a Group III metal. The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, or a combination thereof; or a combination thereof. The Group III-V compound may further include a Group II metal (e.g., InZnP). The Group IV-VI compound may be a binary compound such as SnS, SnSe, SnTe, PbS, PbSe, PbTe, or a combination thereof; a ternary compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof. Examples of the Group I-III-VI compound may include CuInSe$_2$, CuInS$_2$, CuInGaSe, and CuInGaS, but are not limited thereto. Examples of the Group I-IIIV-VI compound may include CuZnSnSe and CuZnSnS, but are not limited thereto. The Group IV element or compound may be a single substance such as Si, Ge, or a combination thereof; a binary element compound such as SiC, SiGe, or a combination thereof; or a combination thereof.

In an embodiment, the first semiconductor nanocrystal may include a metal including indium, zinc, or a combination thereof and a non-metal including phosphorus, selenium, tellurium, sulfur, or a combination thereof. In an embodiment, the second semiconductor nanocrystal may include a metal including indium, zinc, or a combination thereof and a non-metal including phosphorus, selenium, tellurium, sulfur, or a combination thereof.

In an embodiment, the first semiconductor nanocrystal may include InP, InZnP, ZnSe, ZnSeS, ZnSeTe, or a combination thereof; the second semiconductor nanocrystal may be ZnSe, ZnSeS, ZnS, ZnTeSe, or a combination thereof; or a combination thereof. In an embodiment, the shell may include zinc, sulfur, and optionally selenium in the outermost layer.

In an embodiment, the quantum dots may emit blue light or green light and have a core including ZnSeTe, ZnSe, or a combination thereof and a shell including zinc chalcogenide (e.g., ZnS, ZnSe, ZnSeS, or a combination thereof). In the shell, an amount of sulfur may increase or decrease in a radial direction (from the core toward the surface).

In an embodiment, the quantum dots emit red light or green light, and the core may include InP, InZnP, or a combination thereof, while the shell may include Group II a metal including zinc and a non-metal including sulfur, selenium, or a combination thereof.

In an embodiment, when the quantum dots have a core shell structure, an alloyed layer may be present or not on the interface of the core and the shell. The alloyed layer may be a homogeneous alloy or a gradient alloy. In the gradient alloy, an element of the shell may have a concentration gradient changing in a radial direction (e.g., increasing or decreasing toward the center).

In an embodiment, the shell may have a composition changing in the radial direction. In an embodiment, the shell may be a multi-layered shell including at least two layers. In the multi-layered shell, two neighboring layers may have different compositions. In the multi-layered shell, a, e.g., at least one, layer may include semiconductor nanocrystals having a single composition. In the multi-layered shell, a, e.g., at least one, layer may include alloyed semiconductor nanocrystals. In the multi-layered shell, a, e.g., at least one, layer may have a concentration gradient changing in a radial direction in terms of the composition of the semiconductor nanocrystals.

In the quantum dot having the core shell structure, bandgap energy of a shell material may be larger than that of a core material but is not limited thereto. The bandgap energy of the shell material may be smaller than that of the core material. As for the multi-layered shell, an outermost layer material may have a larger bandgap energy than those of materials of the core and inner layers (i.e., closer layers to the core) of the shell. In the multi-layered shell, bandgap of semiconductor nanocrystals of each layer may be appropriately selected to efficiently exhibit a quantum confinement effect.

The quantum dots of an embodiment may include an organic ligand, for example, bound or coordinated on the surface and optionally, a halogen moiety.

The organic ligand may include RCOOH, RNH$_2$, R$_2$NH, R$_3$N, RSH, R$_3$PO, R$_3$P, ROH, RCOOR, RPO(OH)$_2$, RHPOOH, R$_2$POOH, or a combination thereof. Herein, R is independently a C3 to C40 substituted or unsubstituted aliphatic hydrocarbon group (e.g., an alkyl, an alkenyl, an alkynyl, etc.), a C6 to C40 substituted or unsubstituted aromatic hydrocarbon group (e.g., aryl group), or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; an amine such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methylphosphine, ethylphosphine, propylphosphine, butylphosphine, pentylphosphine, octylphosphine, dioctylphosphine, tributylphosphine, trioctylphosphine, and the like; a phosphine compound or an oxide compound thereof such as methylphosphine oxide, ethylphosphine oxide, propylphosphine oxide, butylphosphine oxide pentylphosphine oxide, tributylphosphine oxide, octylphosphine oxide, dioctylphosphine oxide, trioctylphosphine oxide, and the like; diphenylphosphine, diphenylphosphine oxide, triphenylphosphine, or triphenylphosphine oxide; a C5 to C20 alkylphosphonic acid; a C5 to C20 alkylphosphinic acid such as hexylphosphinic acid, octylphosphinic acid, dodecanephosphinic acid, tetradecanephosphinic acid, hexadecanephosphinic acid, octadecanephosphinic acid; and the like, but are not limited thereto.

The halogen moiety may be chlorine, bromine, iodine, or a combination thereof. The halogen moiety may include chlorine.

In an embodiment, the quantum dots may include a first organic ligand and a halogen on the surface and the first organic ligand may include a C6 to C40 aliphatic carboxylic acid compound (e.g., myristic acid, oleic acid, stearic acid, etc.). The carboxylic acid compound may include a compound represented by RCOOH (where R is a C12 or more alkyl group or a C12 or more alkenyl group).

When the quantum dots of an embodiment includes a halogen moiety, an amount of the halogen may be greater than or equal to about 1 microgram (μg), for example, greater than or equal to about 2 μg, greater than or equal to about 3 μg, greater than or equal to about 4 μg, greater than or equal to about 5 μg, greater than or equal to about 6 μg, or greater than or equal to about 7 μg and less than or equal to about 12.5 μg, for example, less than or equal to about 12.4 μg, less than or equal to about 12.3 μg, less than or equal to about 12.2 μg, less than or equal to about 12.1 μg, less than or equal to about 12 μg, less than or equal to about 11.9 μg, or less than or equal to about 11.8 μg, per 1 milligram of the quantum dot. The mole ratio of the halogen (e.g., chlorine) with respect to the organic ligand (e.g., a fatty acid such as oleic acid) may be less than about 2.2:1, for example, less than or equal to about 2:1, less than or equal to about 1.9:1, less than or equal to about 1.8:1, less than or equal to about 1.7:1, or less than or equal to about 1.6:1. The mole ratio of the halogen with respect to the organic ligand may be greater than or equal to about 0.5:1, for example, greater than or equal to about 0.6:1, greater than or equal to about 0.7:1, greater than or equal to about 0.8:1, or greater than or equal to about 0.9:1. A quantum dot including a halogen moiety may be obtained by contacting the quantum dot with a halogen (or halogen-containing organic or aqueous solution) in an organic dispersion.

The quantum dot may adjust the absorption/emission wavelength by adjusting the composition and size. A maximum emission peak wavelength of the quantum dot may have a wavelength range of ultraviolet to infrared wavelengths or higher. For example, the maximum emission peak wavelength of the quantum dot may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum emission peak wavelength of the quantum dot may be I the range of less than or equal to about 800 nm, for example, 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum emission wavelength of the quantum dots may be in the range of about 500 nm to about 650 nm. The quantum dots emit green light and the maximum emission wavelength may be in the range of about 500 nm to about 550 nm. The quantum dots emit red light and the maximum emission wavelength may be in the range of about 600 nm to about 650 nm. The quantum dots emit blue light and the maximum light emitting wavelength may be in the range of greater than or equal to about 440 nm and less than or equal to about 480 nm.

The quantum dots may have quantum efficiency of greater than or equal to about 10%, for example, greater than or equal to about 30%, greater than or equal to about 50%, greater than or equal to about 60%, greater than or equal to about 70%, greater than or equal to about 90%, or greater than or equal to about even 100%. The quantum dots may have a relatively narrow spectrum. The quantum dots may have, for example, a full width at half maximum (FWHM) of an emission wavelength spectrum of less than or equal to about 55 nm, for example less than or equal to about 50 nm, less than or equal to about 45 nm, less than or equal to about 40 nm, or less than or equal to about 30 nm.

The quantum dots may have a particle size of greater than or equal to about 1 nm and less than or equal to about 100 nm (e.g., a diameter or a diameter that is calculated by assuming a spherical shape from an electron microscope image in the case of a non-sphere). The quantum dots may have a size of about 1 nm to about 50 nm, for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, or greater than or equal to about 10 nm and less than or equal to about 50 nm, less than or equal to about 40 nm, less than or equal to about 30 nm, less than or equal to about 20 nm, less than or equal to about 15 nm, or less than or equal to about 10 nm. The shape of the quantum dots is not particularly limited. For example, the shapes of the quantum dots may include spheres, polyhedrons, pyramids, multipods, squares, rectangular parallelepipeds, nanotubes, nanorods, nanowires, nanosheets, or a combination thereof, but are not limited thereto.

The quantum dot may be commercially available or synthesized as appropriately. When a quantum dot is colloid-synthesized, the particle size may be relatively freely controlled and also uniformly controlled.

In an embodiment, the quantum dots (or the light emitting film 13) may not include a thiol-based organic compound or a salt thereof bound to the surface. The thiol-based organic compound or the salt thereof may include butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutylmercaptoacetate, thioglycolic acid, 3-mercaptopropionic acid, thiopronine, 2-mercaptopropionic acid, 2-mercaptopropionate, 2-mercaptoethanol, cysteamine, 1-thioglycerol, mercaptosuccinic acid, L-cysteine, dihydrolipoic acid, 2-(dimethylamino)ethanethiol, 5-mercaptomethyltetrazole, 2,3-dimercapto-1-propanol, glutathione, methoxypolyethylene glycol thiol (m(PEG)-SH), dialkyldithiocarbamic acid, or a metal salt thereof, or a combination thereof.

In an embodiment, the light emitting film 13 may include single layer(s) of quantum dots. In an embodiment, the light emitting film 13 includes a single layer of quantum dots of one or more layers, for example, two or more layers, three or more layers, or four or more layers and 20 or less layers, 10 or less layers, 9 or less layers, 8 or less layers, 7 layers or less, or 6 layers or less. In the light emitting film, the layer of quantum dots may have a single layer or a multi-layered structure in which two or more layers are stacked. In the multilayer structure, adjacent layers (e.g., a first light emitting film and a second light emitting film) may have different physical properties/compositions. In an embodiment, the light emitting film may exhibit a halogen content changing in a thickness direction. In an embodiment, in the light emitting film, the halogen content may increase toward the electron auxiliary layer. In the light emitting film of an embodiment, the halogen content may decrease toward the electron auxiliary layer.

Figure 2:
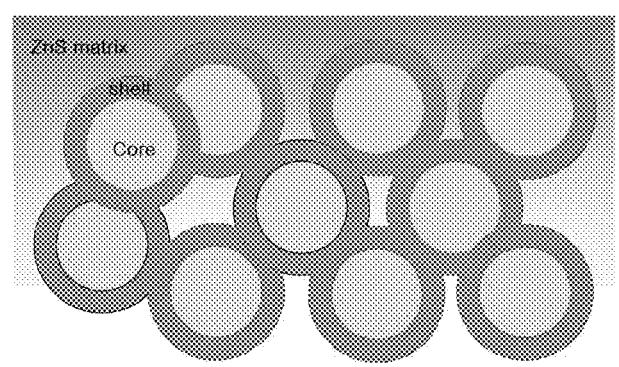
FIG. 2 is a schematic view showing a portion of a cross-section of a light emitting film in a light emitting device according to an embodiment.

In a device of an embodiment, the light emitting film includes a matrix including a metal chalcogenide, and thus the light emitting film (or the first surface thereof) has a composition as described herein. Referring to FIG. 2, the matrix covers at least a portion of the quantum dot layer. The quantum dots may be dispersed within the matrix. At least a portion of the matrix forms a continuous phase. The matrix may be disposed between adjacent quantum dots.

In an embodiment, the metal chalcogenide included in the matrix includes zinc and sulfur. The metal chalcogenide may further include nickel, magnesium, tin, copper, silver, cobalt, or a combination thereof. The metal chalcogenide may further include selenium. The metal chalcogenide may include the same element as the inorganic shell included in the outermost layer of the quantum dots. In other words, the shell material of the quantum dots may be provided as a matrix. In an embodiment, the metal chalcogenide includes zinc sulfide, and the inorganic shell (or outermost layer) of the quantum dots may include zinc sulfide. The metal chalcogenide may be crystalline or amorphous.

The matrix may include a zinc chalcogenide layer (e.g., disposed on the first surface of the light emitting film). The zinc chalcogenide layer may constitute at least a portion (or all) of the first surface of the light emitting film. The first surface of the light emitting film may be formed of the matrix.

In the light emitting film or the first surface thereof, a mole ratio of zinc with respect to selenium may be greater than or equal to about 3.1:1, and a mole ratio of sulfur with respect to selenium may be greater than or equal to about 1.1:1. The composition on the light emitting film or the first surface thereof may be confirmed by X-ray photoelectron spectroscopy, energy dispersive X-ray spectroscopy (EDX, for example, scanning electron microscopy (SEM) EDX or TEM-EDX).

In the first surface of the light emitting film, a mole ratio (Zn:Se) of zinc with respect to selenium may be greater than or equal to about 3.1:1, greater than or equal to about 3.2:1, greater than or equal to about 3.5:1, greater than or equal to about 4:1, greater than or equal to about 4.5:1, greater than or equal to about 5:1, greater than or equal to about 5.5:1, greater than or equal to about 6:1, greater than or equal to about 6.5:1, or greater than or equal to about 7:1. The mole ratio (Zn:Se) of zinc with respect to selenium may be less than or equal to about 15:1, less than or equal to about 14:1, less than or equal to about 13:1, less than or equal to about 12:1, less than or equal to about 11:1, less than or equal to about 10:1, less than or equal to about 9:1, or less than or equal to about 8:1.

In an X-ray photoelectron spectroscopic analysis of the first surface of the light emitting film, a mole ratio (S:Se) of sulfur with respect to selenium may be greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1, greater than or equal to about 3:1, greater than or equal to about 3.1:1, greater than or equal to about 3.2:1, greater than or equal to about 3.3:1, greater than or equal to about 3.4:1, greater than or equal to about 3.5:1, greater than or equal to about 3.6:1, greater than or equal to about 3.7:1, greater than or equal to about 3.8:1, greater than or equal to about 3.9:1, greater than or equal to about 4:1, greater than or equal to about 4.1:1, greater than or equal to about 4.2:1, greater than or equal to about 4.3:1, greater than or equal to about 4.4:1, greater than or equal to about 4.5:1, greater than or equal to about 4.6:1, greater than or equal to about 4.7:1, greater than or equal to about 4.8:1, greater than or equal to about 4.9:1, or greater than or equal to about 5:1. In an X-ray photoelectron spectroscopic analysis of the first surface of the light emitting film, mole ratio (S:Se) of sulfur with respect to selenium may be less than or equal to about 10:1, less than or equal to about 9:1, less than or equal to about 8:1, less than or equal to about 7:1, less than or equal to about 6:1, less than or equal to about 5:1, or less than or equal to about 4.9:1.

The light emitting film further includes an organic compound, and in the light emitting film (or X-ray photoelectron spectroscopy of the first surface thereof), a mole ratio (C:Zn) of carbon with respect to zinc may be greater than or equal to about 0.5:1, greater than or equal to about 0.6:1, greater than or equal to about 0.7:1, greater than or equal to about 0.8:1, greater than or equal to about 0.9:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, or greater than or equal to about 1.8:1. In the light emitting film, the mole ratio of carbon with respect to zinc may be less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, less than or equal to about 2.1:1, less than or equal to about 2:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, or less than or equal to about 1:1.

The light emitting film may further include a halogen. The halogen may be fluorine, chlorine, bromine, iodine, or a combination thereof. In the light emitting film, a mole ratio (halogen:Se) of halogen (e.g., chlorine) with respect to selenium may be greater than or equal to about 0.1:1, greater than or equal to about 0.2:1, greater than or equal to about 0.3:1, greater than or equal to about 0.4:1, greater than or equal to about 0.45:1, greater than or equal to about 0.5:1, greater than or equal to about 0.6:1, greater than or equal to about 0.7:1, greater than or equal to about 0.8:1, greater than or equal to about 0.9:1, greater than or equal to about 1:1, greater than or equal to about 1.5:1, greater than or equal to about 2:1, or greater than or equal to about 2.5:1. In the light emitting film, the mole ratio of halogen with respect to selenium may be less than or equal to about 5:1, less than or equal to about 4:1, less than or equal to about 3.5:1, less than or equal to about 3:1, less than or equal to about 2.5:1, less than or equal to about 2:1, less than or equal to about 1:1, less than or equal to about 0.9:1, less than or equal to about 0.8:1, less than or equal to about 0.7:1, less than or equal to about 0.6:1, or less than or equal to about 0.5:1.

In the first surface of the light emitting film, a mole ratio (Zn:(S+Se)) of zinc with respect to a chalcogen element (e.g., a sum of chalcogen elements) may be greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1 greater than or equal to about 3:1, greater than or equal to about 3.1:1, greater than or equal to about 3.2:1, greater than or equal to about 3.3:1, greater than or equal to about 3.4:1, or greater than or equal to about 3.5:1. In the first surface of the light emitting film, the mole ratio (Zn:(S+Se)) of zinc with respect to a chalcogen element (e.g., a sum of chalcogen elements) may be less than or equal to about 5:1, less than or equal to about 4.9:1, less than or equal to about 4.8:1, less than or equal to about 4.7:1, less than or equal to about 4.6:1, less than or equal to about 4.5:1, less than or equal to about 4.4:1, less than or equal to about 4.3:1, less than or equal to about 4.2:1, less than or equal to about 4.1:1, less than or equal to about 4:1, less than or equal to about 3.9:1, less than or equal to about 3.8:1, less than or equal to about 3.7:1, less than or equal to about 3.6:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.5:1, less than or equal to about 2:1, less than or equal to about 1.9:1, less than or equal to about 1.8:1, or less than or equal to about 1.7:1.

In the first surface of the light emitting film, a mole ratio (Zn:S) of zinc with respect to sulfur may be greater than or equal to about 1.1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, or greater than or equal to about 2.4:1. The mole ratio (Zn:S) of zinc with respect to sulfur may be less than or equal to about 5:1, less than or equal to about 4:1, less than or equal to about 3.5:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, less than or equal to about 2.1:1, less than or equal to about 2:1, less than or equal to about 1.9:1, less than or equal to about 1.8:1, less than or equal to about 1.7:1, or less than or equal to about 1.6:1.

A thickness of the zinc chalcogenide layer may be greater than or equal to about 0.5 nm, greater than or equal to about 1 nm, greater than or equal to about 1.5 nm, or greater than or equal to about 2 nm. The thickness of the zinc chalcogenide layer may be less than or equal to about 10 nm, less than or equal to about 9 nm, less than or equal to about 8 nm, less than or equal to about 7 nm, less than or equal to about 6 nm, or less than or equal to about 5 nm.

The zinc chalcogenide layer may not include selenium. The zinc chalcogenide layer may include zinc sulfide.

In the light emitting film having the aforementioned structure/composition, shelling of zinc chalcogenide about each quantum dot may be reinforced and thus a surface defect influence on a core exciton as generated may be minimized. In addition, since the surface of the light emitting layer may be planarized by the matrix, electric field (E-Field) non-uniformity of the device may be alleviated. The matrix inside the light emitting film may be formed under a mild condition (e.g., a relatively low temperature) of a process as described herein, and oxidation stability of the light emitting film also may be improved. In addition, the zinc chalcogenide layer inside the light emitting film may work as an interlayer between the quantum dot layer and the charge auxiliary layer (e.g., electron auxiliary layer) and thus prevent/suppress interface degradation.

A thickness of the light emitting film 13 may be appropriately selected. The thickness of the light emitting film may be greater than or equal to about 5 nm, for example, 10 nm, greater than or equal to about 15 nm, greater than or equal to about 20 nm, greater than or equal to about 25 nm, or greater than or equal to about 30 nm. The thickness of the light emitting film may be less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting film 13 may have a thickness of about 10 nm to about 150 nm, for example about 10 nm to about 100 nm, or about 10 nm to about 50 nm.

The device of an embodiment may further include a hole auxiliary layer 12 between the anode (e.g., the first electrode) and the light emitting film. The hole auxiliary layer 12 may be one or two or more layers, and may include, for example, a hole injection layer, a hole transport layer, an electron blocking layer, or a combination thereof (not shown).

The hole auxiliary layer 12 may have a HOMO energy level that may be matched with the HOMO energy level of the light emitting film 13, and mobility the holes transferred from the hole auxiliary layer 12 to the light emitting film 13 may be enhanced.

The HOMO energy level of the hole auxiliary layer (for example, hole transport layer) 12 adjacent to, e.g., directly on, the light emitting film may be appropriately adjusted taking into consideration the HOMO energy level of the light emitting film 13. In an embodiment, the hole auxiliary layer 12 may include a hole injection layer disposed close to the first electrode 11 and a hole transport layer disposed close to the light emitting film 13.

A material included in the hole auxiliary layer 12 is not particularly limited. In an embodiment, the hole auxiliary layer may exhibit relatively high hole conductivity. The material of the hole auxiliary layer may include an organic monomolecular compound, a polymer compound, or a combination thereof. A material included in the hole auxiliary layer may include poly(9,9-dioctyl-fluorene-co-N-(4-butylphenyl)-diphenylamine) (TFB), polyarylamine, poly(N-vinylcarbazole), poly(3,4-ethylenedioxythiophene (PEDOT), poly(3,4-ethylenedioxythiophene)polystyrene sulfonate (PEDOT:PSS), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), 4,4',4''-Tris [phenyl(m-tolyl)amino]triphenylamine (m-MTDATA), 4,4', 4''-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

For example, a thickness of the hole auxiliary layer (e.g., hole transport layer, hole injection layer, or combination thereof) may be greater than or equal to about 1 nm, greater than or equal to about 5 nm, greater than or equal to about 10 nm, greater than or equal to about 15 nm, greater than or equal to about 20 nm, or greater than or equal to about 25 nm and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto.

The hole injection layer, the hole transport layer, or a combination thereof may be formed by a solution process (e.g., spin coating, etc.). The hole injection layer, the hole transport layer, or a combination thereof may be formed by a deposition process.

The electronic auxiliary layer 14 is disposed between the light emitting film 13 and the second electrode 15. The electron auxiliary layer 14 may include, for example, an electron injection layer, an electron transport layer, a hole (or electron) blocking layer, or a combination thereof. The electron auxiliary layer may be, for example, an electron injection layer that facilitates electron injection, an electron transport layer that facilitates electron transport, or a hole blocking layer that blocks hole movement, or a combination thereof. For example, an electron injection layer may be disposed between the electron transport layer and the cathode. For example, the hole blocking layer may be disposed between the light emitting layer and the electron transport (injection) layer, but is not limited thereto. The thickness of each layer may be appropriately selected. For example, the thickness of each layer may be greater than or equal to about 1 nm and less than or equal to about 500 nm, but is not limited thereto. The electron injection layer may be an organic layer formed by vapor deposition. The electron transport layer may include inorganic oxide nanoparticles or be an organic layer formed by vapor deposition.

The electron transport layer may include, for example 1,4,5,8-naphthalene-tetracarboxylic dianhydride (NTCDA), bathocuproine (BCP), tris[3-(3-pyridyl)-mesityl]borane (3TPYMB), LiF, tris(8-hydroxyquinolinato) aluminum ($Alq_3$), tris(8-hydroxyquinolinato) gallium ($Gaq_3$), tris(8-hydroxyquinolinato) indium ($Inq_3$), bis(8-hydroxyquinolinato) zinc ($Znq_2$), bis(2-(2-hydroxyphenyl)benzothiazolate) zinc ($Zn(BTZ)_2$), bis(10-hydroxybenzo[h]quinolinato) beryllium ($BeBq_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, $HfO_2$, etc.), or a combination thereof, but is not limited thereto.

The electronic auxiliary layer 14 may include a plurality of metal oxide nanoparticles. The nanoparticles may include a metal oxide including zinc. The metal oxide may include zinc oxide, zinc magnesium oxide, or a combination thereof. The metal oxide may include $Zn_{1-x}M_xO$ (wherein, M is Mg, Ca, Zr, W, Li, Ti, Y, Al, or a combination thereof $0 \leq x \leq 0.5$). In an embodiment, in Chemical Formula 1, M may be magnesium (Mg). In an embodiment, in Chemical Formula 1, x may be greater than or equal to about 0.01 and less than or equal to about 0.3, for example, less than or equal to about 0.25, less than or equal to about 0.2, or less than or equal to about 0.15. An absolute value of LUMO of the aforementioned quantum dots included in the light emitting layer may be smaller than an absolute value of LUMO of the metal oxide. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not be rod-shaped. The nanoparticles may not be in the form of nanowires.

The hole blocking layer may include for example 1,4,5, 8-naphthalene-tetracarboxylic dianhydride (NTCDA), bathocuproine (BCP), tris[3-(3-pyridyl)-mesityl]borane (3TPYMB), LiF, $Alq_3$, Gaq3, Inq3, Znq2, $Zn(BTZ)_2$, $BeBq_2$, or a combination thereof, but is not limited thereto.

In an embodiment, each thickness of the electron auxiliary layer 14 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 3:
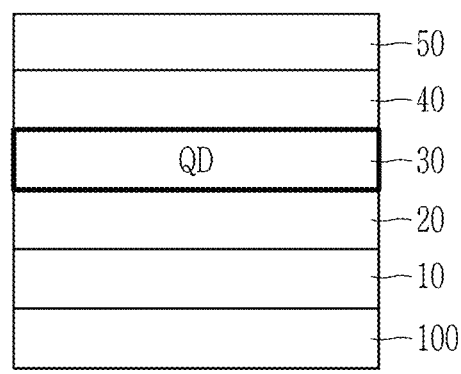
FIG. 3 is a schematic cross-sectional view showing a light emitting device according to an embodiment.

A device according to an embodiment may have a normal structure. In an embodiment, in the device, an anode 10 disposed on a transparent substrate 100 may include a metal oxide-based transparent electrode (e.g., ITO electrode) and a cathode 50 facing the anode 10 may include a conductive metal (Mg, Al, etc.). A hole auxiliary layer 20 (e.g., a hole injection layer of, for example, PEDOT:PSS a p-type metal oxide, or a combination thereof; a hole transport layer of, for example, TFB, poly(9-vinylcarbazole) (PVK), or a combination thereof; or a combination thereof) may be disposed between the transparent electrode 10 and the light emitting layer 30. The hole injection layer may be near to the transparent electrode and the hole transport layer may be near to the light emitting layer. An electron auxiliary layer 40 such as an electron injection layer/a transport layer may be disposed between the quantum dot light emitting layer 30 and the cathode 50. (refer to FIG. 3)

Figure 4:
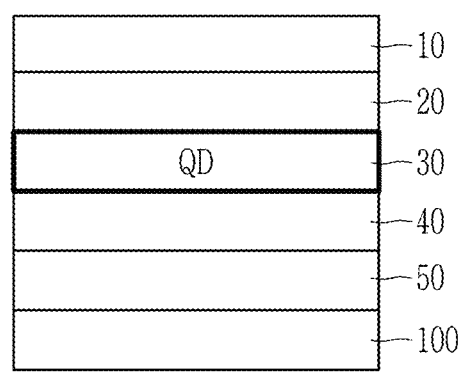
FIG. 4 is a schematic cross-sectional view showing a light emitting device according to an embodiment.

A device according to an embodiment may have an inverted structure. A cathode 50 disposed on the transparent substrate 100 may include a metal oxide-based transparent electrode (e.g., ITO) and an anode 10 facing the cathode may include a metal (Au, Ag, etc.) (e.g., having a relatively high work function). For example, an (optionally doped) n-type metal oxide (crystalline Zn metal oxide) may be disposed between the transparent electrode 50 and the light emitting layer 30 as an electron auxiliary layer (e.g., electron transport layer) 40. $MoO_3$ or another p-type metal oxide may be disposed between the metal anode 10 and the quantum dot emission layer 30 as a hole auxiliary layer 20 (e.g., a hole transport layer including TFB, PVK, or a combination thereof; a hole injection layer including $MoO_3$ or another p-type metal oxide; or a combination thereof). (refer to FIG. 4)

In an embodiment, the light emitting device may have a maximum luminance of greater than or equal to about 10,000 $cd/m^2$, greater than or equal to about 15,000 $cd/m^2$, greater than or equal to about 18,000 $cd/m^2$, or greater than or equal to about 20,000 $cd/m^2$. In an embodiment, the device may have T50 of greater than equal to about 10 hours (h), greater than equal to about 15 h, or greater than equal to about 20 h, greater than or equal to about 25 h, greater than or equal to about 30 h, greater than or equal to about 35 h, greater than or equal to about 40 h, greater than or equal to about 45 h, or greater than or equal to about 50 h. In an embodiment, the device of an embodiment may have a maximum external quantum efficiency (EQE) of greater than equal to about 7%, for example, greater than equal to about 7.5%, or greater than equal to about 7.7%. In an embodiment, the T95 of the device may be greater than or equal to about 6 hours (h), greater than or equal to about 7 h, or greater than or equal to about 8 h.

The device of an embodiment may emit blue light. The blue light may have a maximum emission peak wavelength of greater than or equal to about 445 nm, greater than or equal to about 448 nm, or greater than or equal to about 450 nm and less than or equal to about 460 nm, less than or equal to about 458 nm, or less than or equal to about 455 nm. An emission peak of the blue light may have a full width at half maximum (FWHM) of less than or equal to about 21 nm, for example, less than or equal to about 20 nm, less than or equal to about 19 nm, less than or equal to about 18 nm, or less than or equal to about 17 nm.

In an embodiment, a method of producing the aforementioned light emitting device includes providing a first electrode; forming a light emitting film on the first electrode; and providing a second electrode on the light emitting film. The forming of the light emitting film includes providing a layer including a plurality of quantum dots (hereinafter, quantum dot layer);

adding (e.g., coating) a matrix former in which a sulfur precursor and a zinc precursor are dissolved in a polar solvent to the layer; and heat-treating the layer to which the matrix former is added at a temperature of less than or equal to about 120° C. to form a light emitting film. The matrix former may be added by addition in a dropwise fashion or spin coating.

The method may include forming a hole auxiliary layer on the first electrode (e.g., anode); forming an electronic auxiliary layer on the light emitting film; or a combination thereof.

The details of the first electrode (anode), the electron auxiliary layer, the hole auxiliary layer, and the second electrode (cathode) are the same as described herein. They may be appropriately selected in view of types of these forming materials, the thicknesses of the electrode/layer to be produced, and the like. The forming method may include a solution (wet) process, vapor deposition, or a combination thereof. For example, the aforementioned hole auxiliary layer 12, light emitting film 13, and electron auxiliary layer 14 may be formed by, for example, a solution process. The solution process may include, for example, spin coating, slit coating, inkjet printing, nozzle printing, spraying, doctor blade coating, or a combination thereof, but is not limited thereto.

In an embodiment, when the electronic auxiliary layer includes an inorganic material, formation of the electronic auxiliary layer may be performed by a wet process. In an embodiment, the wet process may include a sol-gel method. In an embodiment, the wet process may include applying a dispersion in which nanoparticles are dispersed in a polar solvent onto a quantum dot light emitting film (e.g., by spin coating, etc.), and drying and annealing the dispersion. The polar solvent may include a C1 to C10 alcohol solvent such as ethanol, a C2 to C20 sulfoxide solvent such as dimethyl sulfoxide, a C2 to C20 amide solvent such as dimethylformamide, or a combination thereof, but is not limited thereto. The annealing may be, for example, performed under vacuum at a predetermined temperature (e.g., greater than or equal to about 60° C., or greater than or equal to about 70° C. and less than or equal to about 100° C., less than or equal to about 90° C., less than or equal to about 80° C., or less than or equal to about 75° C.), but is not limited thereto.

The forming of the quantum dot layer may be performed by obtaining dispersion including quantum dots and applying it or depositing it on a substrate or a charge auxiliary layer in an appropriate manner (e.g., by spin coating, inkjet printing, etc.). The coated or deposited quantum dot layer may be heat treated for drying or the like. The heat-treatment temperature is not particularly limited, and may be appropriately selected taking into consideration the boiling point of the organic solvent used for preparing the dispersion. For example, the heat-treatment temperature may be greater than or equal to about 60° C. The type of the organic solvent for the quantum dot-containing dispersion is not particularly limited and may be appropriately selected. In an embodiment, the organic solvent may include (substituted or unsubstituted) aliphatic hydrocarbon organic solvent, (substituted or unsubstituted) aromatic hydrocarbon organic solvent, an acetate solvent, or a combination thereof.

The formed quantum dot layer may be treated with an organic solution including a halogen compound (e.g., a metal halide). This treatment may remove organic materials (e.g., organic ligands or organic solvents) (e.g., a native organic material bound to a surface of a quantum dot) from the formed quantum dot layer. The halogen compound may include a metal halide. The halogen compound may include a Group II metal (e.g., zinc). The metal halide may include fluoride, chloride, bromide, iodide, or a combination thereof. In an embodiment, the metal halide may include zinc chloride. The organic solution may include a polar solvent, for example, C1 to C10 alcohol. The treatment may include contacting of the organic solution (e.g., by spin coating) with a quantum dot layer and removing of the solution (heat drying).

The alcohol solvent may include, for example, C1 to C10 alcohol, for example, methanol, ethanol, propanol, isopropanol, butanol, pentanol, hexanol, or heptanol. A concentration of the halogen compound in the organic solution may be greater than or equal to about 0.001 grams per liter (g/L), for example, greater than or equal to about 0.01 g/L, greater than or equal to about 0.1 g/L, greater than or equal to about 1 g/L, greater than or equal to about 10 g/L, greater than or equal to about 50 g/L, greater than or equal to about 60 g/L, greater than or equal to about 70 g/L, greater than or equal to about 80 g/L, or greater than or equal to about 90 g/L and less than or equal to about 1000 g/L, for example, 500 g/L, less than or equal to about 400 g/L, less than or equal to about 300 g/L, less than or equal to about 200 g/L, less than or equal to about 100 g/L, less than or equal to about 90 g/L, less than or equal to about 80 g/L, less than or equal to about 70 g/L, less than or equal to about 60 g/L, less than or equal to about 50 g/L, less than or equal to about 40 g/L, less than or equal to about 30 g/L, less than or equal to about 20 g/L, or less than or equal to about 10 g/L, but is not limited thereto.

The removing of the organic solution from the quantum dot layer may include washing the contacted quantum dot layer with an alcohol solvent (e.g., addition of the alcohol solvent and optionally spin-coating). The washing may be performed one or more times, for example, two or more times, or three or more times. The quantum dot layer may be heated (optionally after washing). The heating temperature may be greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. The heating temperature may be less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., less than or equal to about 110° C., less than or equal to about 100° C., or less than or equal to about 90° C.

A matrix former is added (or coated) to the formed quantum dot layer, and heat-treated at a temperature of less than or equal to about 120° C. to form a light emitting film.

The matrix former may be produced by dissolving a sulfur precursor and a zinc precursor in a polar solvent.

The sulfur precursor may be an organic compound having no thiol group. The sulfur precursor may include a thioamide compound (e.g., thioacetamide), a thiourea compound, a thioester compound, a dithioester compound, or a combination thereof. The zinc precursor may include a zinc halide compound, a zinc ester compound, zinc nitrate, a zinc carboxylate compound, or a combination thereof. The zinc precursor may include $ZnCl_2$, $Zn(Ac)_2$, $Zn(NO_3)_2$, $Zn(BF_4)_2$, Zn-oleate, or a combination thereof. The polar solvent may include a C1 to C10 alcohol solvent, or a combination thereof.

A ratio between the sulfur precursor and the zinc precursor may be appropriately selected. In an embodiment, a sulfur content per 1 mole of zinc may be greater than or equal to about 0.01 mole, greater than or equal to about 0.05 mole, greater than or equal to about 0.1 mole, greater than or equal to about 0.5 mole, greater than or equal to about 1 mole, greater than or equal to about 5 mole, or greater than or equal to about 10 mole. In an embodiment, the sulfur content per 1 mole of zinc may be less than or equal to about 100 mole, less than or equal to about 50 mole, less than or equal to about 40 mole, less than or equal to about 30 mole, less than or equal to about 20 mole, less than or equal to about 10 mole, less than or equal to about 5 mole, less than or equal to about 4 mole, less than or equal to about 3 mole, less than or equal to about 2 mole, less than or equal to about 1 mole, less than or equal to about 0.5 mole, less than or equal to about 0.1 mole, or less than or equal to about 0.05 mole.

A total precursor concentration in the matrix former is not particularly limited and may be appropriately selected taking into consideration types of the precursors and the like.

The matrix former may be added by addition in a drop-wise fashion or spin coating. The film to which the matrix former is added form a matrix by heating. The heating temperature may be greater than or equal to about 30° C., greater than or equal to about 40° C., greater than or equal to about 50° C., or greater than or equal to about 60° C. The heating temperature may be less than or equal to about 120° C., less than or equal to about 110° C., less than or equal to about 100° C., less than or equal to about 90° C., or less than or equal to about 80° C. The temperature may be adjusted according to the matrix former.

The method may further include washing the formed light emitting film one or more times with a polar solvent (e.g., alcohol).

Hereinafter, the embodiments are illustrated in more detail with reference to examples. However, these examples are exemplary, and the present scope is not limited thereto.

EXAMPLES

Analysis Methods

1. Photoluminescence Analysis and Ultraviolet (UV) Spectroscopy (1) Photoluminescence (PL) spectra of the prepared nanocrystal are obtained using a Hitachi F-7000 spectrometer at an irradiation wavelength of 380 nanometers (nm).

(2) Hitachi U-3310 spectrometer is used to perform a UV spectroscopy and obtain UV-Visible absorption spectra.

2. Transmission Electron Microscopy (TEM) and Transmission Electron Microscopy with Energy-Dispersive X-Ray Spectroscopy (TEM-EDX) Analysis (1) Transmission electron microscopic analysis is performed on the top surface or the cross-section of the produced device or structure using a UT F30 Tecnai electron microscope.

(2) TEM-EDX analysis is performed on the top or cross-section of the produced device or structure using TEM-Tecnai G2.

3. Electroluminescence Spectroscopy

Electroluminescent properties are evaluated using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated.

4. Life-Span Characteristics

T50 (hours (h)): When driving at 650 nits (candelas per square meter), the time (hours (hr)) for luminance to become 50% of an initial luminance 100% is measured.

T95 (h): When driving at 650 nits, the time (hr) for luminance to become 95% of an initial luminance 100% is measured.

Quantum Dot Synthesis

Reference Examples 1-1 and 1-2: Preparation of Quantum Dot (OA-QD)

(1) Selenium (Se) and tellurium (Te) are dispersed in trioctylphosphine (TOP) to obtain a Se/TOP stock solution and Te/TOP stock solution. In a reactor including trioctylamine, 0.125 millimoles (mmol) of zinc acetate is added together with oleic acid (OA) and heated to 120° C. under vacuum. After 1 hour, the atmosphere in the reactor is converted into nitrogen.

Subsequently, the reactor is heated up to 300° C., the prepared Se/TOP stock solution and Te/TOP stock solution are rapidly injected thereinto in a Te:Se mole ratio of 1:25. After the reaction is completed, acetone is added to the reaction solution that is rapidly cooled into room temperature, and a precipitate obtained by centrifugation is dispersed in toluene to obtain ZnTeSe quantum dots.

(2) 1.8 mmol (0.336 grams (g)) of zinc acetate along with oleic acid is put in a flask containing trioctylamine and vacuum-treated at 120° C. for 10 minutes. After the flask is internally substituted with nitrogen ($N_2$), the temperature is increased to 180° C. Subsequently, the ZnTeSe core obtained in Synthesis Example 1 is added thereto, and each predetermined amount of Se/TOP and S/TOP are injected thereinto. The reaction temperature is set at about 280° C. After the reaction is completed, the reactor is cooled, and the prepared nanocrystals are centrifuged with ethanol and dispersed in toluene to obtain ZnTeSe/ZnSeS core shell quantum dots. It is confirmed that the first absorption peak wavelength of the obtained quantum dots is about 410 nm, and the PL wavelength and quantum yield (QY) are about 453 nm and 85%, respectively.

Reference Example 2: Preparation of Halogen-Treated Quantum Dot (Cl-QD)

Quantum dots are prepared according to the same method as Reference Example 1, and quantum dot organic dispersion is obtained by dispersing the quantum dots in toluene. On the other hand, zinc chloride is dissolved in ethanol at a concentration of 10 wt % to obtain a zinc chloride solution. Subsequently, 0.01 milliliters (mL) of the zinc chloride solution is added to the quantum dot organic dispersion and then, stirred at 60° C. for 30 minutes for a surface exchange reaction. After the reaction, ethanol is added thereto to induce a precipitation, and quantum dots are recovered through centrifugation.

Synthesis of Metal Oxide Nanoparticles

Reference Example 3: ZnMgO Synthesis

Zinc acetate dihydrate and magnesium acetate tetrahydrate are added into a reactor including dimethylsulfoxide to provide a mole ratio shown in the following chemical formula and heated at 60° C. under air. Subsequently, an ethanol solution of tetramethylammonium hydroxide pentahydrate is added into the reactor in a dropwise fashion at a speed of 3 mL per minute. After stirring the same, the obtained $Zn_xMg_{1-x}O$ nanoparticles are centrifuged and dispersed in ethanol to provide $Zn_xMg_{1-x}O$ nanoparticles. (x=0.85)

The obtained nanoparticles are performed with an X-ray diffraction analysis, and it is confirmed that a ZnO crystal is formed. The obtained nanoparticles are performed with a transmission electron microscopic analysis, and the results show that the particles have an average size of about 3 nm.

Example 1: Production of Light Emitting Film

Zinc nitrate and thioacetamide (TAA) are dissolved in 10 mL of ethanol to from a transparent solution (hereinafter, a matrix former). (a mole ratio=1:1, a concentration of the solution: 0.2 moles per liter (M)).

The quantum dot solution according to Reference Example 1 is spin-coated on a Si wafer to form a film, washed with ethanol (EtOH), heat-treated at 80° C. for 30 minutes to form a 36 nm-thick quantum dot layer.

On the quantum dot layer, the matrix former is added thereto through spin coating and then, heat-treated at 80° C. for 20 minutes. The heat-treated film is spin-washed twice with ethanol to obtain a light emitting film.

X-ray photoelectron spectroscopy is performed on the formed light emitting film, and the results are shown in Table 1.

Figure 5:
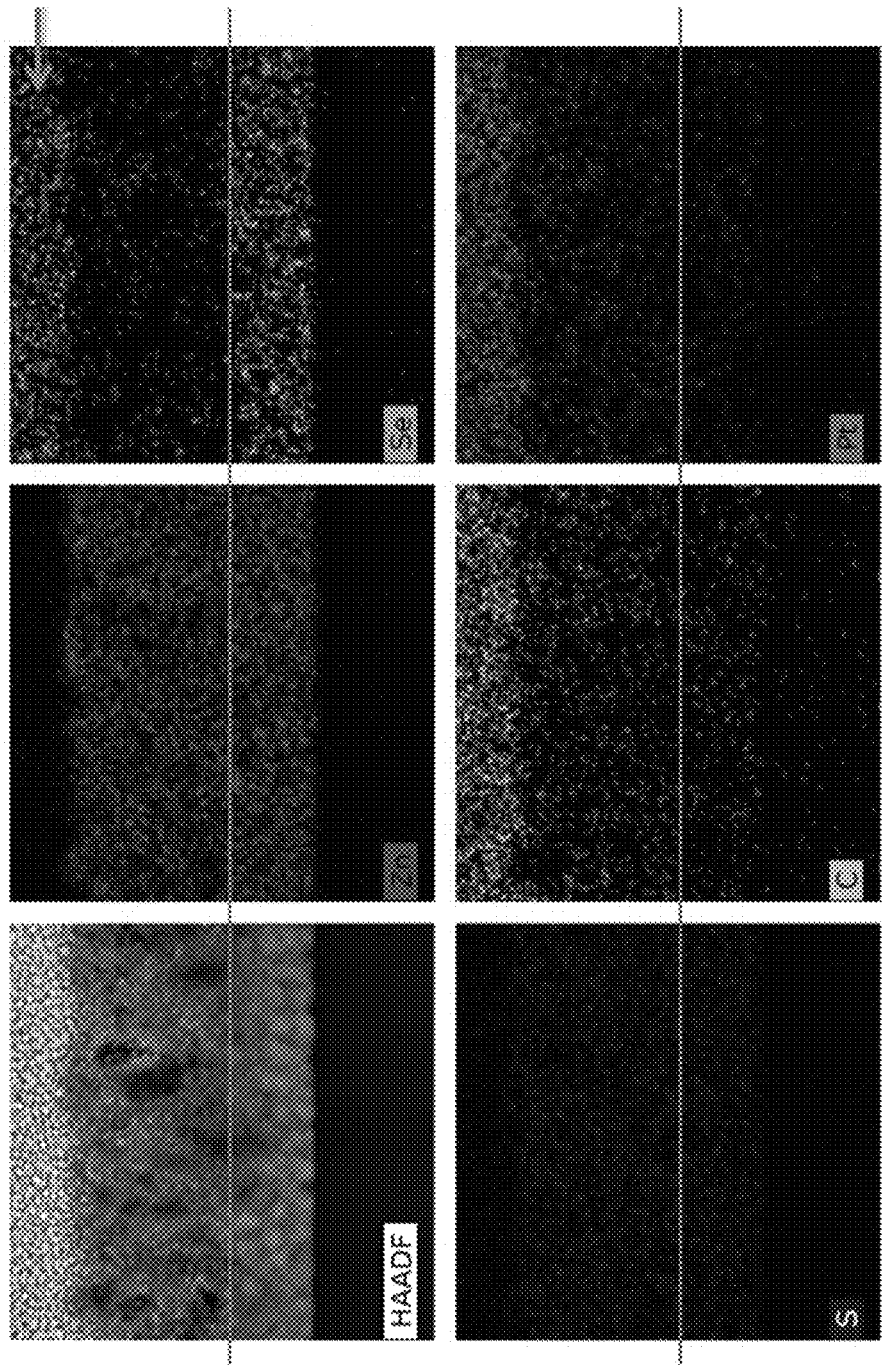
FIG. 5 is a view showing the results of transmission electron microscopy with energy-dispersive X-ray spectroscopy (TEM-EDX) analysis of a portion of the light-emitting film produced in Example 1.

After forming a light emitting film on an Si wafer according to the same method as above and then, obtaining a cross-sectional specimen of the structure by using FIB (focused ion beam), a transmission electron microscope-energy dispersive spectral analysis is performed, and the result is shown in FIG. 5.

Comparative Example 1

A light emitting film is formed according to the same method as Example 1 except that the treatment by using the matrix former is not used. X-ray photoelectron spectroscopy is performed on the formed light emitting film, and the results are shown in Table 1.

TABLE 1

| Samples | (C1s) C:Zn | (S2p) Zn:S | S:Se | Zn:Se | Zn:(S + Se) |
|---|---|---|---|---|---|
| Comparative Example 1: EtOH × 3 wash (reference) | 2.98:1 | 1.88:1 | 1.3:1 | 2.4:1 | 1.05:1 |
| Example 1: $ZnNO_3$/ TAA, 80° C., EtOH × 1 wash, 80° C. | 0.719:1 | 1.51:1 | 4.7:1 | 7.1:1 | 1.24:1 |

Example 2-1

A light emitting device having an indium tin oxide (ITO)/poly(3,4-ethylenedioxythiophene)polystyrene sulfonate (PEDOT:PSS)/poly(9,9-dioctyl-fluorene-co-N-(4-butylphenyl)-diphenylamine) (TFB)/light emitting film/ ZnMgO/Ag structure is manufactured in the following method:

Zinc chloride and thioacetamide are dissolved in 10 mL of ethanol to prepare a transparent solution (hereinafter, a matrix former). (a mole ratio=1:1, a concentration of the solution: 0.2 M).

A glass substrate deposited with ITO is surface-treated with UV-ozone for 15 minutes, a PEDOT:PSS solution (H.C. Starks GmbH) is spin-coated and then, heat-treated under an air atmosphere at 150° C. for 10 minutes and also, at 150° C. under a $N_2$ atmosphere for 20 to 30 minutes to form a 30 nm-thick hole injection layer (HIL). Subsequently, on the hole injection layer (HIL), a poly[(9,9-dioctylfluorenyl-2,7-diyl-co(4,4'-(N-4-butylphenyl)diphenylamine] solution (TFB) (Sumitomo Corp.) is spin-coated and then, heat-treated at 150° C. for 30 minutes to form a 25 nm-thick hole transport layer (HTL).

On the hole transport layer (HTL), the quantum dot solution according to Reference Example 1 is spin-coated, and the obtained film is washed with ethanol and heat-treated at 80° C. for 30 minutes to form a 36 nm-thick quantum dot layer.

On the quantum dot layer, the matrix former is added through spin-coating and then, heat-treated at 80° C. for 20 minutes. The heat-treated film is washed twice with ethanol to obtain a light emitting film.

Example 2-2

A device is manufactured according to the same method as Example 2-1 except for the following:

Zinc chloride is dissolved in ethanol to prepare a treatment solution (a concentration: 0.1 grams per milliliter (g/mL)). On the hole transport layer (HTL), the quantum dot solution obtained in Reference Example 1 is spin-coated and then, heat-treated at 80° C. for 30 minutes. On the heat-treated film, the treatment solution is added in a dropwise fashion and then, allowed to stand for 1 minute, a part of the treatment solution is removed with a spin-coater and then, three times washed with ethanol, and is dried on an 80° C. hot plate for 20 minutes (SPD).

Comparative Example 2

A device is manufactured according to the same method as Example 2-1 except for the treatment by using the matrix former is not performed. X-ray photoelectron spectroscopy is performed on the formed light emitting film, and the results are shown in Table 2. The electroluminescent properties of the produced device are evaluated, and the results are shown in Table 3.

TABLE 2

| Samples | C:Zn | Zn:S | Cl:Se | S:Se | Zn:Se | Zn:(S + Se) |
|---|---|---|---|---|---|---|
| Comparative Example 2: EtOH × 3 wash (reference) | 2.36:1 | 3.09:1 | — | 0.95:1 | 2.94:1 | 1.50:1 |
| Example 2-1: $ZnCl_2$/TAA, 100° C., 30 min | 1.527:1 | 2.03:1 | 2.90:1 | 4.54:1 | 9.23:1 | 1.66:1 |

TABLE 3

| | | External Quantum Efficiency (EQE) Maximum (Max) (%) | Luminance Max (candelas per square meter ($cd/m^2$)) | Candelas per Ampere (cd/A) Max | Lambda Max (nm) | T95 (h) | T50 (h) |
|---|---|---|---|---|---|---|---|
| Comparative Example 2 | EtOH × 3 wash, OA (36 nm) | 5.9 | 15,020 | 3.1 | 452 | 0.21 | 5.3 |
| Example 2-1 | EtOH × 3 wash, $ZnCl_2$/TAA, OA | 8.8 | 23,250 | 5.0 | 453 | 0.56 | 13.4 |
| Example 2-2 | SPD, $ZnCl_2$/TAA, OA | 9.5 | 24,910 | 5.4 | 453 | 0.78 | 16.8 |

A solution of the ZnMgO nanoparticles according to Reference Example 3 is prepared. The prepared solution is spin-coated on the light emitting film and then, heat-treated at 80° C. for 30 minutes to form an electron transport layer (ETL).

On the electron transport layer (ETL), aluminum (Al) is vacuum-deposited to be 90 nm thick to form a second electrode.

X-ray photoelectron spectroscopy is performed on the formed light emitting film, and the results are shown in Table 2.

The electroluminescent properties of the produced device are evaluated, and the results are shown in Table 3.

Referring to Tables, the devices of examples exhibit improved light emitting properties and life-span characteristics compared with the devices of comparative examples.

Example 3-1

A device is manufactured according to the same method as Example 2-1 except that the halogen-treated quantum dots of Reference Example 2 are not used.

The electroluminescent properties of the produced device are evaluated, and the results are shown in Table 4.

Example 3-2

A device is manufactured according to the same method as Example 2-2 except that the halogen-treated quantum dots of Reference Example 2 are used.

The electroluminescent properties of the produced device are evaluated, and the results are shown in Table 4.

Comparative Example 3

A device is manufactured according to the same method as Example 3-1 except that the treatment by using the matrix former was not performed.

The electroluminescent properties of the produced device are evaluated, and the results are shown in Table 4.

TABLE 4

| | | Lum Max (cd/m$^2$) | Lamda Max (nm) | T95 (h) | T50 (h) |
|---|---|---|---|---|---|
| Comparative Example 3 | EtOH × 3 wash, Cl 36 nm | 32,620 | 453 | 2.65 | 26.6 |
| Example 3-1 | EtOH × 3 wash, ZnCl$_2$/TAA, Cl | 32,350 | 453 | 7.84 | 54.2 |
| Example 3-2 | SPD, ZnCl$_2$/TAA, Cl | 31,920 | 453 | 6.19 | 59.6 |

Referring to the results of Table 4, the devices of examples exhibit improved life-span characteristics compared with the devices of comparative examples.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A light emitting device comprising
   a first electrode and a second electrode spaced from each other, and
   a light emitting film between the first electrode and the second electrode,
   wherein the light emitting film has a first surface facing the second electrode and a second surface opposite the first surface,
   the light emitting film comprises
      a quantum dot layer comprising a plurality of quantum dots and
      a matrix comprising a metal chalcogenide,
   the plurality of quantum dots comprises selenium,
   the matrix covers at least a portion of the quantum dot layer,
   the metal chalcogenide comprises zinc and sulfur, and
   in the first surface of the light emitting film, a mole ratio of zinc with respect to selenium is greater than or equal to about 2:1 and a mole ratio of sulfur with respect to selenium is greater than or equal to about 1.1:1.

2. The light emitting device of claim 1, wherein the metal chalcogenide further comprises selenium.

3. The light emitting device of claim 1, wherein the plurality of quantum dots does not comprise cadmium, lead, or a combination thereof.

4. The light emitting device of claim 1, wherein the quantum dots comprise
   a core comprising a first semiconductor nanocrystal and
   a shell disposed on the core, the shell comprising a second semiconductor nanocrystal having a composition different from a composition of the first semiconductor nanocrystal.

5. The light emitting device of claim 4, wherein the first semiconductor nanocrystal and the second semiconductor nanocrystal are independently a Group II-VI compound, a Group III-V compound, a Group IV-VI compound, a Group IV element or a compound thereof, a Group I-III-VI compound, a Group I-II-IV-VI compound, or a combination thereof.

6. The light emitting device of claim 4, wherein the first semiconductor nanocrystal comprises indium, zinc, or a combination thereof.

7. The light emitting device of claim 4, wherein the quantum dots comprise zinc and sulfur in an outermost layer of the shell.

8. The light emitting device of claim 1, wherein the quantum dots comprise InP, InZnP, ZnSe, ZnSeTe, or a combination thereof.

9. The light emitting device of claim 1, wherein
   the matrix comprises a zinc chalcogenide layer, and
   the zinc chalcogenide layer comprises at least a portion of the first surface of the light emitting film.

10. The light emitting device of claim 9, wherein a thickness of the zinc chalcogenide layer is greater than or equal to about 0.5 nanometers.

11. The light emitting device of claim 9, wherein a thickness of the zinc chalcogenide layer is less than or equal to about 10 nanometers.

12. The light emitting device of claim 1, wherein in an X-ray photoelectron spectroscopic analysis of the first surface of the light emitting film, a mole ratio of zinc with respect to selenium is greater than or equal to about 3.2:1 and a mole ratio of sulfur with respect to selenium is greater than or equal to about 1.3:1.

13. The light emitting device of claim 1, wherein in an X-ray photoelectron spectroscopic analysis of the first surface of the light emitting film, mole ratio of zinc with respect to selenium is greater than or equal to about 4:1 and a mole ratio of sulfur with respect to selenium is greater than or equal to about 3:1.

14. The light emitting device of claim 1, wherein
   the light emitting film further comprises an organic compound, and
   in an X-ray photoelectron spectroscopic analysis of the first surface of the light emitting film, a mole ratio of carbon with respect to zinc is greater than or equal to about 0.5:1.

15. The light emitting device of claim 14, wherein in the light emitting film, a mole ratio of carbon with respect to zinc is less than or equal to about 3:1.

16. The light emitting device of claim 1, wherein the light emitting film further comprises a halogen and a mole ratio of halogen with respect to selenium is greater than or equal to about 0.3:1.

17. The light emitting device of claim 1, wherein in the first surface of the light emitting film, a mole ratio of zinc with respect to a sum of chalcogen elements is greater than or equal to about 1.1:1.

18. The light emitting device of claim 1, wherein
   the light emitting device further comprises an electron auxiliary layer directly on the first surface of the light emitting film, and
   the electron auxiliary layer comprises metal oxide nanoparticles.

19. The light emitting device of claim 18, wherein a metal oxide of the metal oxide nanoparticles is represented by Chemical Formula 1:

$$Zn_{1-x}M_xO \qquad \text{Chemical Formula 1}$$

wherein, in Chemical Formula 1,
M is Mg, Ca, Zr, W, Li, Ti, Y, Al, or a combination thereof, and
$0 \leq x \leq 0.5$.

20. The light emitting device of claim 1, wherein the light emitting device has a maximum luminance of greater than or equal to about 10,000 candelas per square meter or a T95 of greater than or equal to about 6 hours.

21. A method of producing the light emitting device of claim 1, comprising
providing the first electrode;
forming the light emitting film on the first electrode by providing the layer comprising the plurality of quantum dots;
adding a matrix former in which a sulfur precursor and a zinc precursor are dissolved in a polar solvent to the layer comprising the plurality of quantum dots; and
heat-treating the layer comprising the plurality of quantum dots to which the matrix former is added at a temperature of less than or equal to about 120° C. to form the light emitting film on the first electrode; and
providing the second electrode on the light emitting film to produce the light emitting device.

22. The method of claim 21, wherein the sulfur precursor comprises a thioamide compound, a thioester compound, or a combination thereof, and
the zinc precursor comprises a zinc halide compound, a zinc ester compound, a zinc nitrate compound, a zinc carboxylate compound, or a combination thereof.

* * * * *